(12) United States Patent
Summerfelt et al.

(10) Patent No.: US 11,251,138 B2
(45) Date of Patent: Feb. 15, 2022

(54) THROUGH WAFER TRENCH ISOLATION BETWEEN TRANSISTORS IN AN INTEGRATED CIRCUIT

(71) Applicant: Texas Instruments Incorporated, Dallas, TX (US)

(72) Inventors: Scott Robert Summerfelt, Garland, TX (US); Thomas Dyer Bonifield, Dallas, TX (US); Sreeram Subramanyam Nasum, Bangalore (IN); Peter Smeys, San Jose, CA (US); Benjamin Stassen Cook, Los Gatos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 16/717,262

(22) Filed: Dec. 17, 2019

(65) Prior Publication Data

US 2020/0203290 A1 Jun. 25, 2020

Related U.S. Application Data

(60) Provisional application No. 62/783,377, filed on Dec. 21, 2018.

(51) Int. Cl.
*H01L 23/00* (2006.01)
*H01L 23/29* (2006.01)
(Continued)

(52) U.S. Cl.
CPC ...... *H01L 23/564* (2013.01); *H01L 21/76232* (2013.01); *H01L 21/78* (2013.01);
(Continued)

(58) Field of Classification Search
CPC ... H01L 23/564; H01L 23/293; H01L 23/642; H01L 23/3121; H01L 21/78; H01L 21/76232
See application file for complete search history.

(56) References Cited

U.S. PATENT DOCUMENTS 9,419,075 B1 8/2016 Carothers et al.
10,199,461 B2 2/2019 Carothers et al.
(Continued)

OTHER PUBLICATIONS

"Parylene", Wikipedia, available at https://en.wikipedia.org/wiki/Parylene on Sep. 3, 2019, pp. 1-12.
(Continued)

*Primary Examiner* — Quoc D Hoang
(74) *Attorney, Agent, or Firm* — Michael A. Davis, Jr.; Charles A. Brill; Frank D. Cimino

(57) ABSTRACT

In described examples of an integrated circuit (IC) there is a substrate of semiconductor material having a first region with a first transistor formed therein and a second region with a second transistor formed therein. An isolation trench extends through the substrate and separates the first region of the substrate from the second region of the substrate. An interconnect region having layers of dielectric is disposed on a top surface of the substrate. A dielectric polymer is disposed in the isolation trench and in a layer over the backside surface of the substrate. An edge of the polymer layer is separated from the perimeter edge of the substrate by a space.

10 Claims, 10 Drawing Sheets

(51) Int. Cl.
  *H01L 21/78* (2006.01)
  *H01L 23/64* (2006.01)
  *H01L 21/762* (2006.01)
  *H01L 23/31* (2006.01)

(52) U.S. Cl.
  CPC ........ *H01L 23/293* (2013.01); *H01L 23/3121* (2013.01); *H01L 23/642* (2013.01)

(56) References Cited

U.S. PATENT DOCUMENTS

| | | | |
|---|---|---|---|
| 2011/0163332 A1* | 7/2011 | Ma | H01L 51/5243 257/88 |
| 2016/0099195 A1* | 4/2016 | Huang | H01L 21/76898 257/414 |

OTHER PUBLICATIONS

Rabih Khazaka et al, "Parameters Affecting the DC Breakdown Strength of Parylene F Thin Films", 2011 Annual Report Conference on Electrical Insulation and Dielectric Phenomena, Oct. 16-19, 2011, Cancun, Mexico, pp. 740-743.

Sombel Diaham et al, "Electrical Conduction in Parylene HT: Transient and Steady-state Analyses at High Temperature", IEEE Transactions on Dielectrics and Electrical Insulation, vol. 22, No. 4, Aug. 2015, pp. 2329-2338.

Sombel Diaham et al, "Electrical Conductivity of Parylene F at High Temperature", Journal of Electronic Materials, vol. 40, No. 3, 2011, pp. 295-300.

Ying L. Yeh and William F. Gorham, "Preparation and Reactions of Some [2.2] Paracyclophane Derivatives", The Journal of Organic Chemistry, vol. 34, No. 8, Aug. 1969, pp. 2366-2370.

* cited by examiner

THROUGH WAFER TRENCH ISOLATION BETWEEN TRANSISTORS IN AN INTEGRATED CIRCUIT

CROSS-REFERENCE TO RELATED APPLICATION

This application claims priority to U.S. Provisional Patent Application No. 62/783,377 filed 21 Dec. 2018, the entirety of which is incorporated herein by reference.

TECHNICAL FIELD

This relates to through wafer trench isolation and to capacitive coupling of signals between regions separated by through wafer trench isolation.

BACKGROUND

Some electronic circuits include components with large differences in operating potentials, and the semiconductor substrates of the components within an integrated circuit (IC) package must be electrically isolated. Putting the isolated components in separate IC die, also referred to as a "chip," undesirably increases chip count and cost of the circuits. Putting the isolated components in the same chip with a common semiconductor substrate requires isolating portions of the substrate, which has been problematic and costly.

SUMMARY

In described examples of an integrated circuit (IC) there is a substrate of semiconductor material having a first region with a first transistor formed therein and a second region with a second transistor formed therein. A through wafer trench extends through the substrate and separates the first region of the substrate from the second region of the substrate. An interconnect region having layers of dielectric is disposed on a top surface of the substrate. A dielectric polymer is disposed in the isolation trench and in a layer over a backside surface of the substrate. An edge of the polymer layer is separated from the perimeter edge of the substrate by a space. A moisture diffusion barrier may be included on the outer surface and the edge of the polymer layer.

In another described example, a first plate of a three-dimensional (3D) capacitor is coupled to the first transistor and a second plate is coupled to the second transistor. A portion of the through wafer trench is located between the first plate and the second plate. The first plate is formed in a separate portion of the first region defined by a second through wafer trench, and the second plate is formed in a separate portion of the second region defined by a third through wafer trench.

DETAILED DESCRIPTION

Figure 1A:
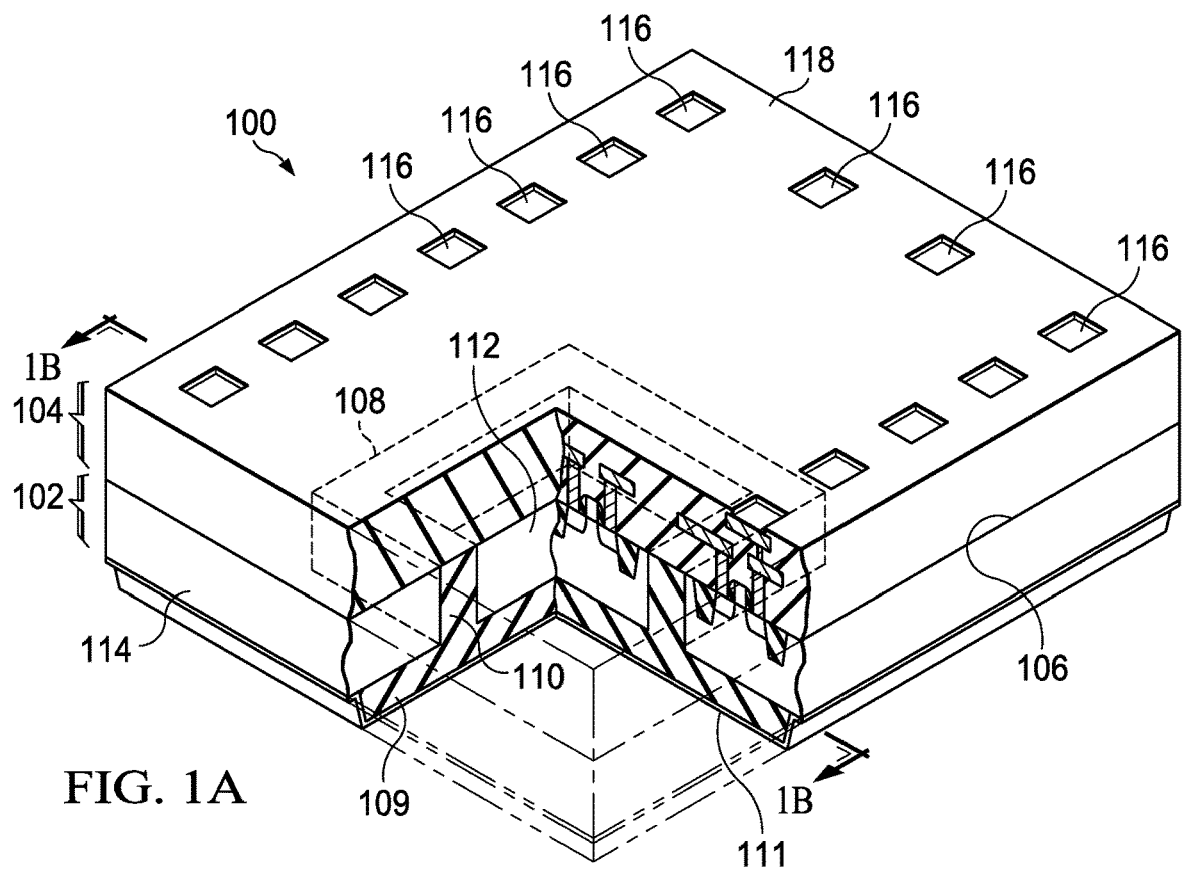
FIGS. 1A-1C are views of an example semi-conductor device containing an isolation region formed by a through wafer trench.

In the drawings, like elements are denoted by like reference numerals for consistency.

Voltage isolation is a critical need for integrated circuits that are designed to handle high voltages. Conventionally, IC devices typically use shallow or even deep trench isolation to provide voltage isolation for different regions of devices. Shallow trenches may be used for moderate voltages, while deep trenches are required for higher voltage regions. Shallow and even deep trench isolation only provides dielectric isolation for the surface layers of the silicon (Si) chip. Diode isolation may be used to provide isolation to the Si substrate. A problem with diode isolation is that it takes a lot of distance to isolate large voltages. Dielectric isolation intrinsically requires less distance.

Conventionally, complete dielectric isolation requires silicon on insulator (SOI) wafer or multiple die. Silicon on insulator technology refers to the use of a layered silicon—insulator—silicon substrate in place of conventional silicon substrates in semiconductor manufacturing. SOI-based devices differ from conventional silicon-built devices in that the silicon junction is above an electrical insulator, typically silicon dioxide or sapphire. SOI wafers may be used to eliminate diode isolation. This solution is typically used for higher voltage products. Typical SOI wafers may use a layer of silicon dioxide (SiO2) as the insulator. However, the thickness of the SiO2 layer is limited and therefore the maximum voltage rating is limited.

Another solution is to use multiple devices either in a same package or over multiple packages. There is a significant increase in cost and package complexity with this approach. The package dielectric or board isolation is therefore providing dielectric isolation. This is a conventional solution for higher voltage applications.

As will be described in more detail hereinbelow, a semiconductor device is formed on a substrate of a semiconductor material. An interconnect region containing contacts and metal lines and possibly vias is formed on a top surface of the substrate. One or more trenches are etched completely through the substrate of the IC and filled with a polymer dielectric to provide high voltage isolation between high voltage and low voltage regions of the IC. This is referred to herein as a "through wafer trench" (TWT). An additional layer of polymer dielectric on the backside of the IC provides high voltage isolation of the IC substrate from a metallic heat sink and/or circuit board on which the IC is mounted. The thickness of the through wafer trench and the backside polymer dielectric can be selected to provide voltage isolation for voltages up to 12 KV or higher. One or more 3D capacitors may be formed in the substrate by through wafer trenches and used for communication between a low voltage domain and a high voltage domain.

An example process for forming through wafer trenches is described in U.S. Pat. No. 9,419,075, "Wafer Substrate Removal," Dan Carothers, et al, and is incorporated by reference herein.

Figure 1C:
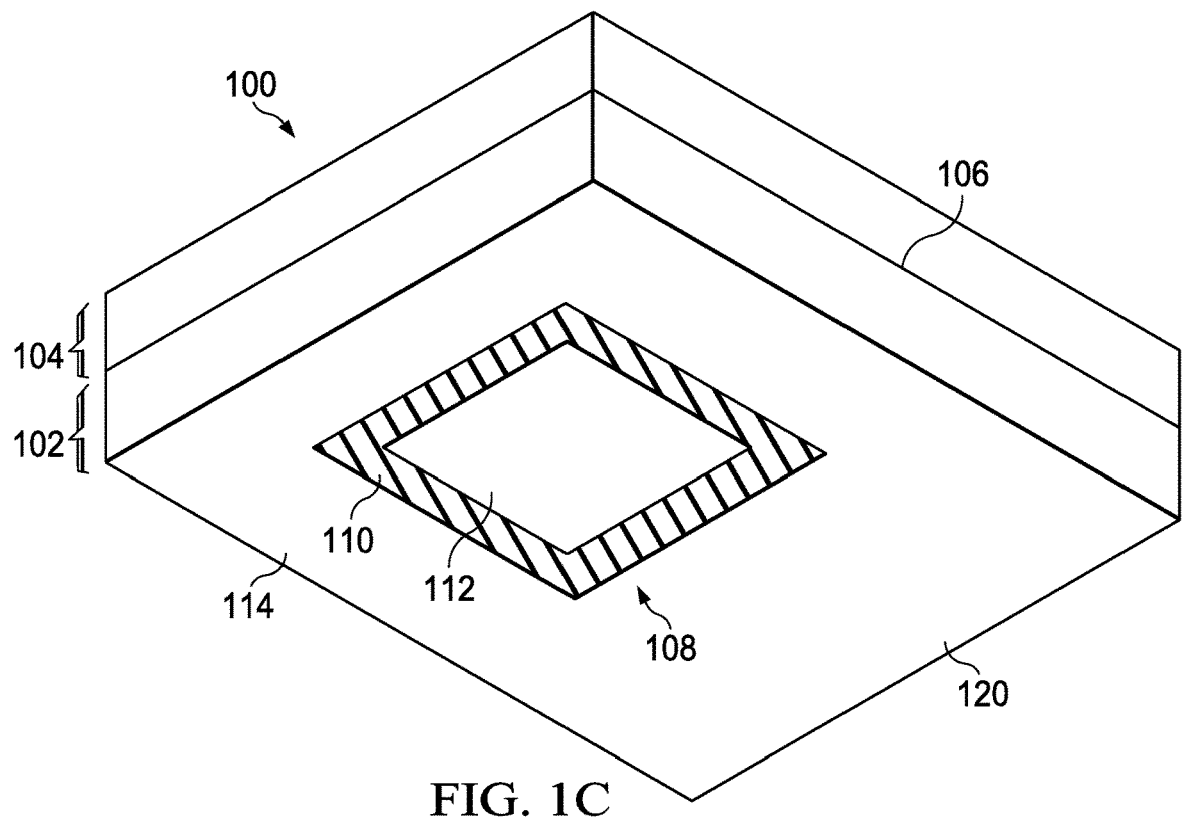
Figure 1B:
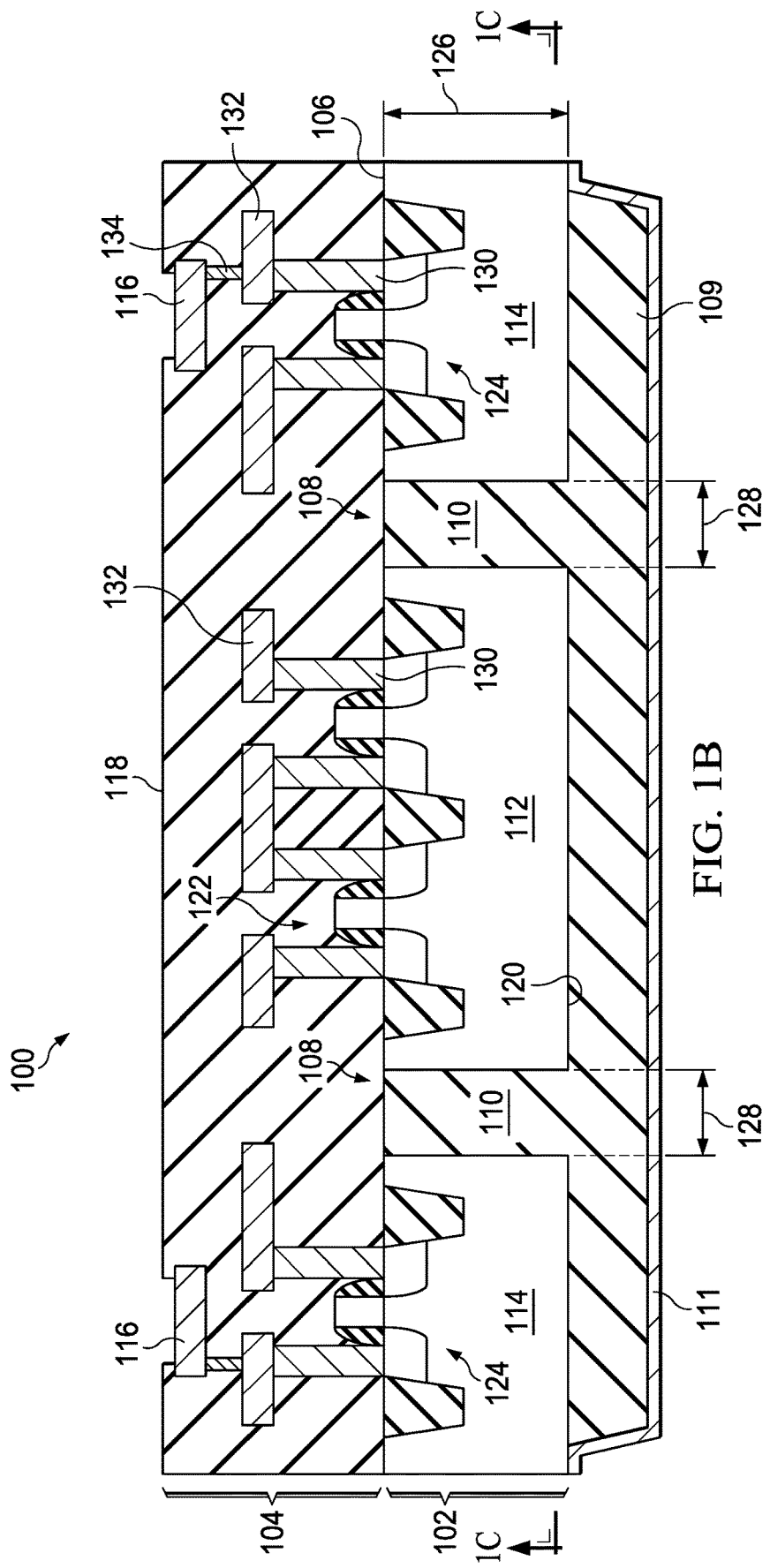

FIG. 1A through FIG. 1C are views of an example semiconductor device 100 that has an isolation region 112 formed by a through wafer trench region 108. In this example, the isolated region 112 contains an isolated component 122. FIG. 1A is a top perspective view of semiconductor device 100 that includes a substrate 102 that is a semiconductor material such as silicon. The substrate 102 may be from a bulk semiconductor wafer and may optionally include an epitaxial layer of semiconductor material. The semiconductor device 100 includes an interconnect region 104 at a top surface 106 of the substrate 102. The interconnect region 104 includes layers of dielectric material, one or more levels of metal lines, contacts connecting the metal lines to components in the substrate 102, and vias connecting the metal lines of different levels. The semiconductor device 100 further includes a through wafer trench region 108 in which the semiconductor material has been removed from the substrate 102 and replaced with dielectric fill material 110. In the instant example, the dielectric fill material 110 in the TWT region 108 laterally surrounds an isolated portion 112 of the substrate 102. In this example, isolated portion 112 is isolated using a dielectric and hence can be any voltage from the surrounding region. In particular this could be a high voltage region. A primary portion 114 of the substrate 102 is outside of the TWT region 108 and abuts the TWT region 108. In this example, primary portion 114 is a low voltage region. In the instant example, the primary portion 114 laterally surrounds the TWT region 108 and the isolated portion 112. The TWT region 108 separates the isolated portion 112 from the primary portion 114 of the substrate 102. A backside dielectric layer 109 is continuous over the isolated portion 112, the TWT region 108, and a portion of primary portion 114. A diffusion barrier 111 overlies and seals backside dielectric layer 109.

In some cases the diffusion barrier 111 is an insulator. In these cases the backside dielectric may not cover all of the isolated region 112. Since this layer is an insulator it still provides dielectric isolation between two regions 112 and 114. This situation can be additionally modified by removing diffusion barrier 111 over part of the backside and depositing and patterning an additional metal layer over the insulating diffusion barrier 111. By doing this, different voltage regions (112 and 114) can all be electrically connected or electrically isolated from additional packaging to the backside of the wafer. The interconnect region 104 is continuous over the TWT region 108. The interconnect region 104 has a top surface 118 at an opposite face of the interconnect region 104 from the top surface 106 of the substrate 102. In the instant example, the semiconductor device 100 includes bond pads 116 at the top surface 118 of the interconnect region 104. While a single component 122 is illustrated within isolated portion 112 for clarity, typically many components will be included with isolated region 112. Similarly, typically many components will be included within primary portion 114.

FIG. 1B is a cross section through the semiconductor device 100. TWT region 108 extends vertically from a bottom surface 120 of the substrate 102 all the way through wafer substrate 102 to the interconnect region 104. The dielectric fill material 110 substantially fills the TWT region 108 and forms the continuous backside layer 109. In this example, the dielectric fill material is fluorinated parylene (parylene-F or -HTC or -AF4). In other examples, the dielectric fill material may be a non-fluorinated parylene compound. In other examples, the dielectric fill material may include organic dielectric material such as epoxy, polyimide, silicone, Teflon, or benzocyclobutene (BCB). Alternately, the dielectric fill material 110 may include inorganic dielectric material such as glass, ceramic or silicon dioxide-based inorganic material formed from siloxane-containing solution or sol-gel. In all cases the dielectric is dense enough to provide dielectric isolation between the different regions of the substrate 112 and 114 with appropriate voltage rating.

In this example, a moisture diffusion barrier 111 is formed over backside dielectric layer 109. As will be described in more detail hereinbelow, the dielectric properties of parylene can be improved by heating to drive out moisture and then sealing with diffusion barrier 111 to prevent absorption of moisture. In this example, diffusion barrier 111 is a layer of silicon nitride (SiN). In other examples, other types of material may be used for oxygen/moisture diffusion barrier 111, such as silicon oxynitride (SiOxNy), aluminum oxide (AlOx), etc. The moisture barrier 111 can also be a metal such as Ta, Ti, TiW, TaN, TiN, Al, Cu, Ag, or Au or other interconnect or package metal systems. The metal provides not only a good moisture barrier but also metal connection to preferred voltage regions such as 114 and also good thermal conductor. In most cases it is important that the metal barrier 111 does not penetrate too far into the trench region 110.

An isolated component 122, depicted in FIG. 1B as an inverter, is disposed in the isolated portion 112 of the substrate 102. While a single isolated component 122 is illustrated for clarity, additional active and/or passive components may be located within isolated portion 112. The dielectric fill material 110 in the TWT region 108 separates the isolated component 122 from the primary portion 114 of the substrate 102. Active components 124 of the semiconductor device 100 are disposed in the primary portion 114 of the substrate 102. While two active components 124 are illustrated for clarity, additional active and/or passive components may be located within primary portion 114. A thickness 126 of the substrate 102 may be 200 microns for a thinned substrate 102 to 600 microns for a full-thickness substrate 102. In the instant example, a width 128 of the isolation region 108 may be, for example, 5 microns to 50 microns. Contacts 130, metal lines 132 and vias 134 in the interconnect region 104 provide electrical connections to the isolated component 122 and the active components 124, and to the bond pads 116.

FIG. 1C is back-side cross-sectional perspective view of the semiconductor device 100. Disposing the isolated portion 112 of the substrate 102 in the semiconductor device 100 may advantageously reduce a total cost of circuit application using the semiconductor device 100 compared to disposing the isolated portion 112 in a separate semiconductor device.

Figure 2:
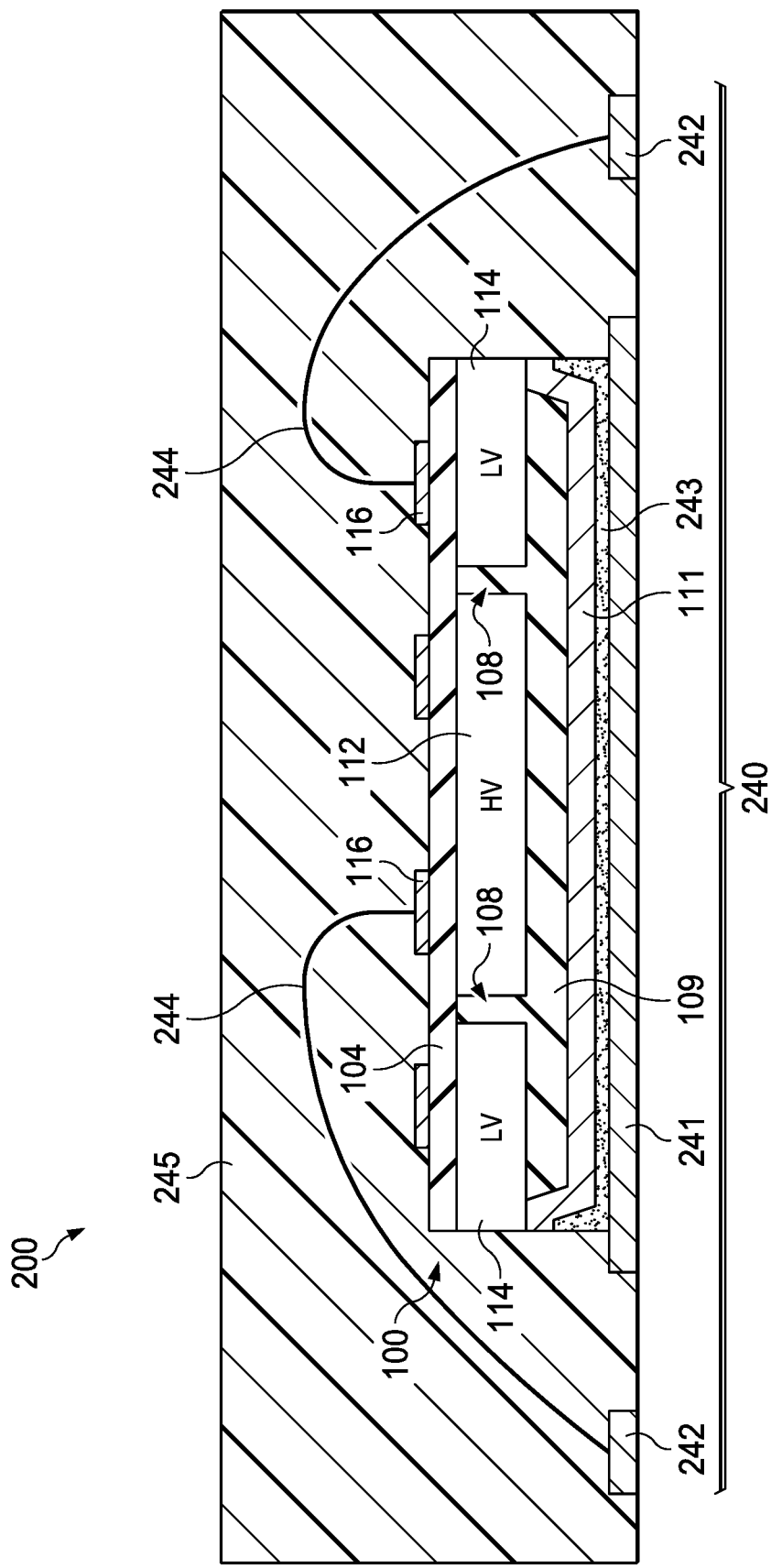
FIG. 2 is a simplified cross-sectional view of the example IC of FIG. 1 mounted on an example lead frame.

FIG. 2 is a simplified cross-sectional view of the example IC 100 of FIG. 1 that illustrates IC 100 mounted on an example lead frame 240. IC die 100 may also be referred to as a "chip." IC die 100 may be fabricated using known or later developed semiconductor processing techniques. IC die 100 may include an epitaxial (epi) layer on the top surface in which are formed various semiconductor transistor devices and interconnects. One or more conductive layers may be formed on the epi layer and patterned into interconnect traces and bond pads within interconnect region 104.

Lead frame 240 includes a die attach pad (DAP) 241 and multiple leads 242. DAP 241 provides that provides support and heat dissipation and may also be referred to as a "thermal pad." IC die 100 is attached to DAP 241 using a layer of heat conductive glue 243. Leadframes are used in the fabrication of various types of packaged ICs, such as a quad flat no-leads package (QFN), a quad flat package (QFP), a dual in-line package (DIP), etc. A set of bond wires 244 is attached to leads 242 and respective bond pads 116 located on the surface of IC die 100 using known or later developed wire bonding techniques. After wire bonding is complete, IC 100 is encapsulated using mold compound 245 using known or later developed IC packaging techniques to form a completed packaged IC 200.

In this example, the packaged IC 200 is a quad flat no-leads package. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of printed circuit boards (PCBs) without through-holes. Flat no-lead is a near chip scale package plastic encapsulated package made with a planar copper leadframe substrate. Perimeter lands on the package bottom provide electrical connections to the PCB. Other examples may be packaged using other known or later developed packaging technologies, such as a quad-flat package, a ball grid array, etc. using the techniques disclosed herein to form an encapsulated package with isolated regions.

Figure 3:
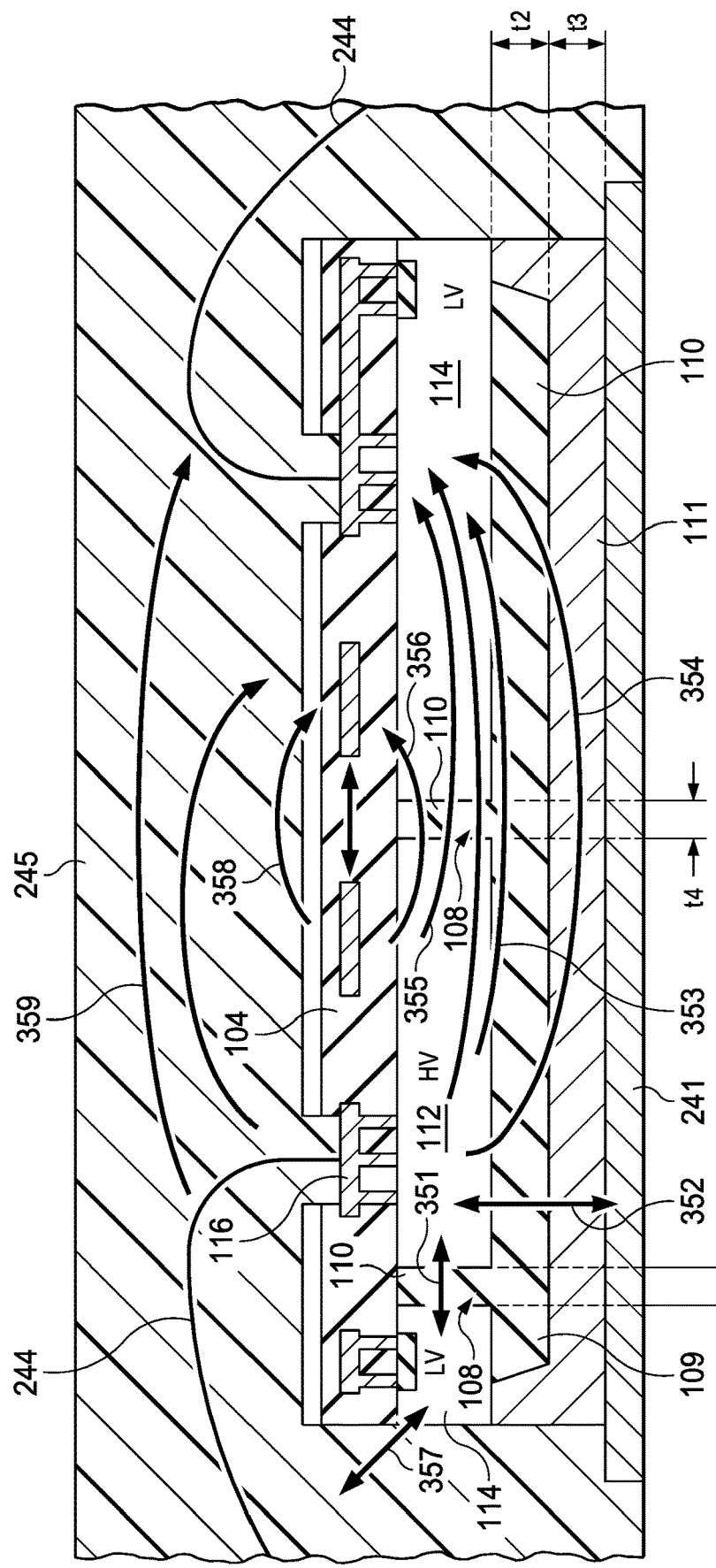
FIG. 3 is a simplified cross-sectional view of a portion of the example packaged IC of FIG. 2 illustrating potential voltage breakdown paths.

FIG. 3 is a simplified cross-sectional view of a portion of the example packaged IC 100 of FIG. 2 illustrating potential voltage breakdown paths. Breakdown path 351 from high voltage region 112 to low voltage region 114 involves TWT region 108. The thickness t1 of TWT 108 and the dielectric characteristics of dielectric fill material 110 determine a minimum breakdown voltage for path 351. Similarly, breakdown path 352 from high voltage region 112 to DAP 241 involves backside dielectric layer 109, and diffusion barrier 111. The thickness t2 of backside dielectric layer 109, the thickness t3 of diffusion barrier 111, and the dielectric characteristics of dielectric fill material 110 and diffusion barrier 111 determine a minimum breakdown voltage for path 352. In various examples, thickness t2 of backside dielectric polymer layer is selected from a range of 5-50 microns. In some examples, a thickness of greater than 50 microns may be selected.

A minimum breakdown voltage for each breakdown path 353, 354, is determined by thickness t2 of backside dielectric layer 109, thickness t3 of diffusion barrier 111, and the dielectric characteristics of dielectric fill material 110 and diffusion barrier 111. A minimum breakdown voltage for each breakdown path 355, 356, is determined by thickness t1 of TWT 108 and the dielectric characteristics of dielectric fill material 110.

A minimum breakdown voltage in other breakdown paths, such as path 357 from bond wire 244 to low voltage region 114, path 358 between interconnect lines in interconnect region 104, and path 359 between bond wires 244 is determined by the dielectric characteristics of interconnect region 104 and encapsulation material 245.

As can be seen, the polymer layer 109 on the backside of IC 100 helps the voltage isolation on the backside of the wafer in addition to one or more trench dielectrics 108. The voltage isolation on the backside can be tuned by just changing the thickness t2 of the backside polymer dielectric layer 109 and the thickness t3 of diffusion barrier 111.

Figure 4:
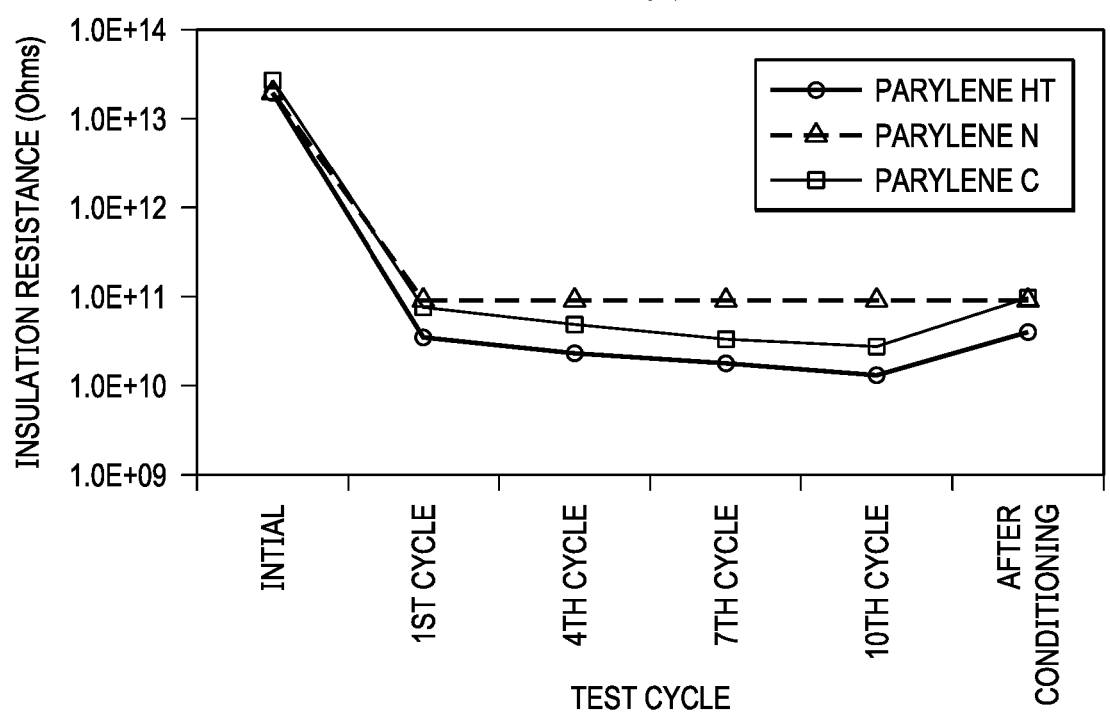
FIG. 4 is a plot illustrating the effect of moisture on the insulation resistance of parylene.

FIG. 4 is a plot illustrating the effect of moisture on the insulation resistance of parylene. This example illustrates results of testing parylene HT, parylene N, and parylene C in accordance with Mil-STD 202, method 302, at a temperature of 65° C., 90-96% relative humidity. As can be seen in these plots, just one exposure cycle of the parylene samples to moisture causes the insulation resistance to fall from approximately 1.0 E+13 ohms to less than 1.0 E+11 ohms, a loss in resistance of over 100×. After several cycles the loss in resistance for some of the samples is greater than 1000×.

It has now been determined that post deposition baking of parylene significantly improves insulation resistance by removing diffused moisture and may also improve reliability. However, these benefits require keeping the parylene dry afterwards. Moisture barrier 111 (see FIG. 1B, 2) is deposited over backside parylene layer 109 to seal out moisture after baking the chip with the deposited parylene 109 in place.

The coefficient of thermal expansion (CTE) of parylene-F is approximately 38-45 ppm/C. This large CTE may cause cracks in the protective diffusion barrier 111. To overcome the potential for cracking, a diffusion barrier such as SiN is applied in a thick enough layer to prevent cracking. Another option for a diffusion barrier is to use a metal layer that is sufficiently ductile to prevent cracking, such as copper. The moisture diffusion barrier 111 can also be a metal such as Ta, Ti, TiW, TaN, TiN, Al, Cu, Ag, or Au or other interconnect or package metal systems.

Figure 5:
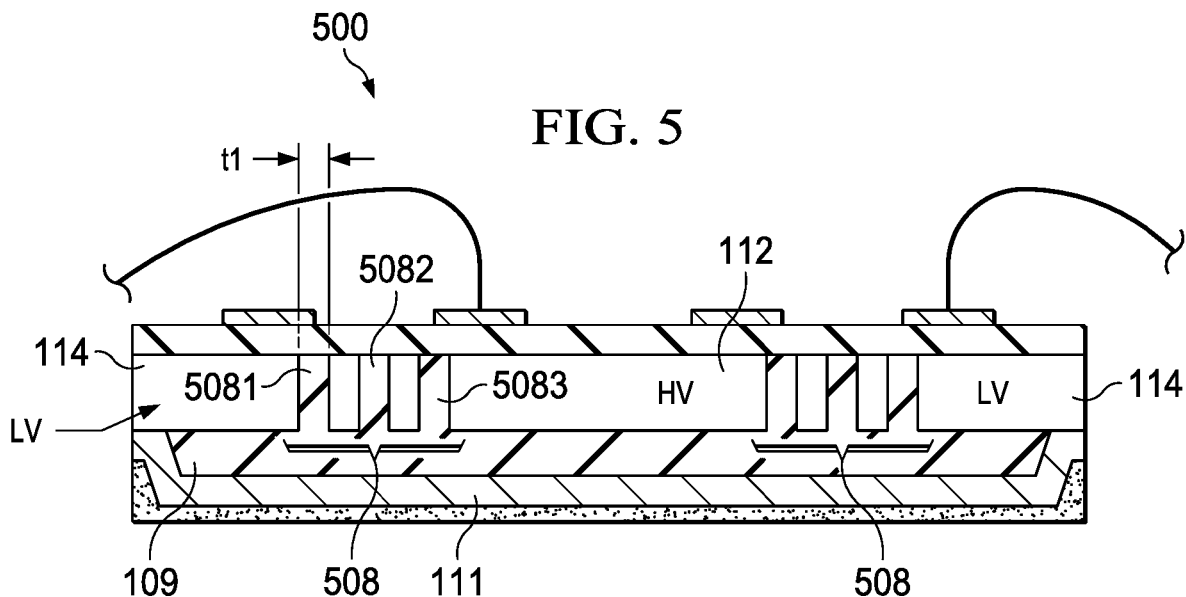
FIG. 5 is a cross-sectional view of another example IC that that uses through wafer trenches and a backside layer of dielectric polymer for voltage isolation.

FIG. 5 is a cross-sectional view of another example IC 500 that that uses through wafer trenches and a backside layer of dielectric polymer for voltage isolation. In this example, TWT region 508 includes three separate TWTs 5081, 5082, 5083 that are located next to each other Thin parylene films exhibit a thickness dependent crystallinity that seems to cause the dielectric strength in MV/cm to drop off as the thickness of the film increases above approximately 5-10 µm. Therefore, multiple thin TWT trenches may have a higher total dielectric strength than a single thick TWT region. In this example, TWT 5081 has a thickness t1 equal to approximately 8-9 µm. TWTs 5082, 5083 have a similar thickness.

In this example, three trenches 5081, 5082, 5083 are illustrated. In another example, only two trenches may be implemented. In another example, four or more trenches may be implemented. In some examples, the trenches may have different thicknesses.

In another example, two or more thin trenches such as 5081, 5082 may have a respective width selected from a range of 3-30 microns.

Figure 6:
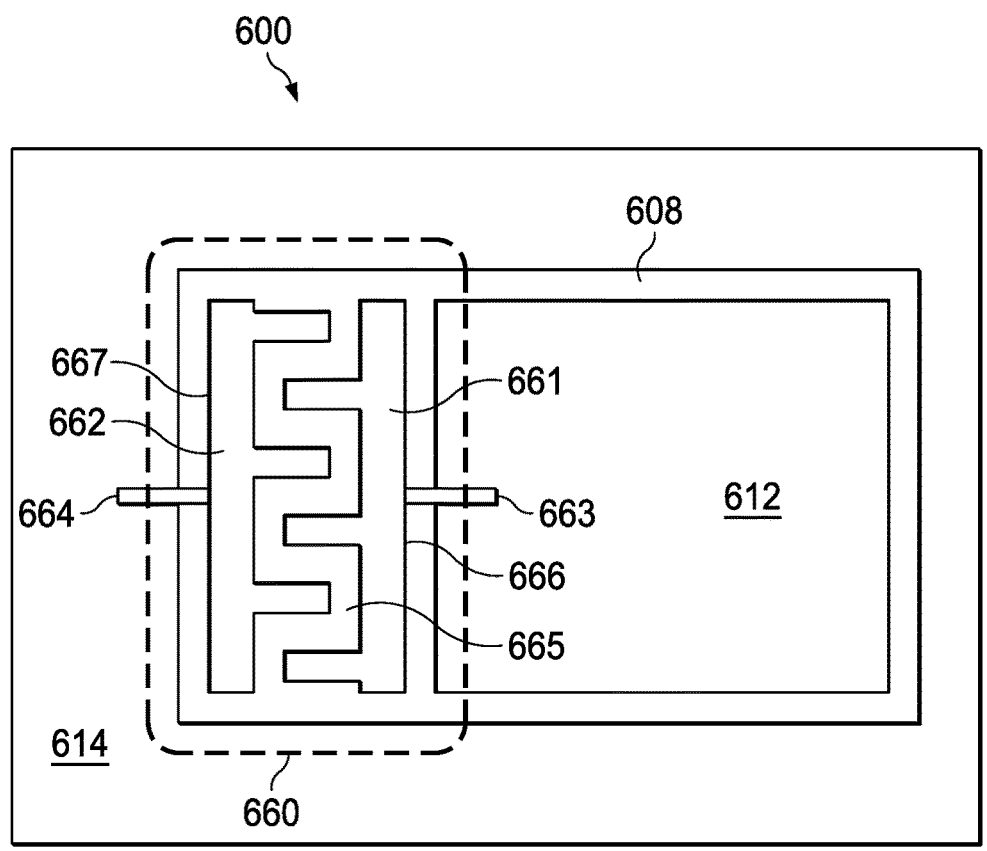
FIG. 6 illustrate a three-dimensional (3D) capacitor that is formed between separate voltage domains with through wafer trenches.

FIG. 6 is a top view of another example IC 600 illustrating a three-dimensional (3D) capacitor 660 that is formed between separate voltage domains 612, 614 by through wafer trenches 666, 667. One of the issues when using different voltage regions is communication between different voltage regions. Capacitor 660 is isolated from voltage regions 612, 614 using a thinner trench 666, 667 to create capacitor 660 for isolation communication. In this example, a TWT that includes generally straight portions indicated at 608 and a serpentine portion 665 surrounds high voltage region 612 and thereby electrically isolates it from low voltage region 614. Serpentine portion TWT portion 665 follows a serpentine path that folds back and forth in order to provide a large sidewall surface area that provides enough capacitance to facilitate capacitive communication between high voltage region 612 and low voltage region 614. TWT region 666 in high voltage region 612 in conjunction with serpentine TWT portion 665 forms capacitor plate 661, while TWT region 667 in low voltage region 614 in conjunction with serpentine TWT portion 665 forms capacitor plate 662. Contact trace 663 couples plate 661 to communication circuitry 771 (FIG. 7) in high voltage region 612 while contact trace 664 couples plate 662 to communication circuitry 772 (FIG. 7) in low voltage region 614.

Figure 7:
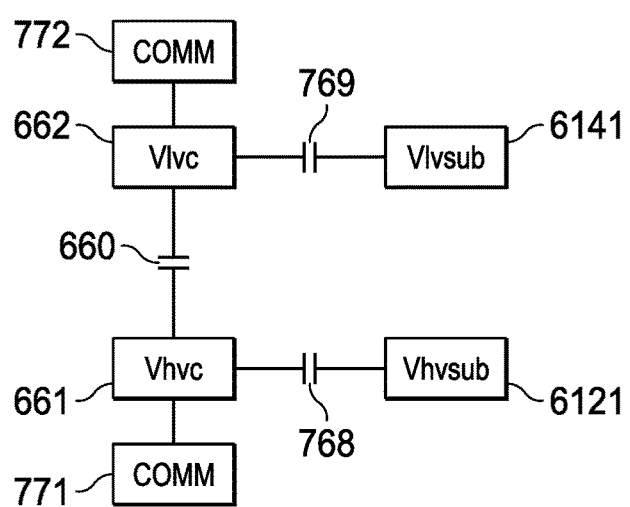
FIG. 7 is a schematic illustrating capacitive communication across a 3D capacitor.

FIG. 7 is a schematic illustrating capacitive communication between voltage regions 612, 614 using 3D capacitor 660, as described with reference to FIG. 6. Parasitic capacitor 768 to the substrate region 6121 of high voltage region 612 and parasitic capacitor 769 to the substrate region 6141 of low voltage region 614 is minimized by minimizing the trench width of respective TWT regions 666, 667.

FIGS. 8A-8K are cross-sectional views of a portion of a semiconductor wafer 800 illustrating process steps for fabrication of semiconductor device 100 having regions separated by TWT regions and having a backside layer of dielectric polymer. As will be described in more detail hereinbelow, the backside layer of dielectric polymer is patterned and removed from the cut-lines between devices on the semiconductor wafer. A diffusion barrier is then applied over the remaining backside layer of dielectric polymer. In this manner, the remaining backside layer of dielectric polymer is not exposed when the semiconductor devices are separated. In this example, semiconductor device 100 is illustrated as described in more detail in FIGS. 1A-1C, and FIG. 2. In another example, a similar process may be used to fabricate other types of semiconductor devices, such as semiconductor devices 500 (FIG. 5), 600 (FIG. 6), etc.

Figure 8A:
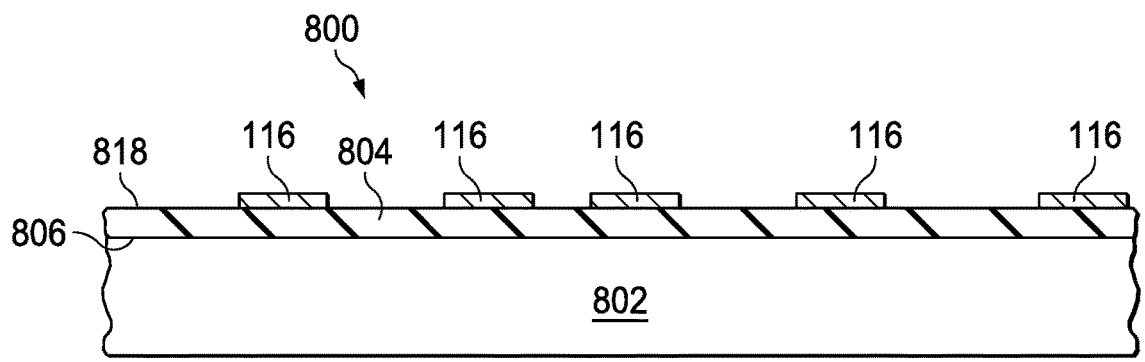
FIGS. 8A-8K are cross-sectional views of a portion of a wafer illustrating process steps for fabrication of a wafer with a backside layer of dielectric polymer.

Referring to FIG. 8A, the semiconductor device 100 (see FIG. 8K) is formed on wafer 800 that has a substrate 802 comprising a semiconductor material such as silicon. In this example, the substrate 802 is a bulk semiconductor wafer 800 containing a plurality of semiconductor devices 100. The substrate 802 may optionally include an epitaxial layer of semiconductor material. The semiconductor device 100 includes an interconnect region 804 formed at a top surface 806 of the substrate 802. The interconnect region 804 includes layers of dielectric material, one or more levels of metal lines, contacts connecting the metal lines to components in the substrate 802, and possibly vias connecting the metal lines of different levels. In the instant example, the semiconductor device 100 includes bond pads 116 at, or proximate to, a top surface 818 of the interconnect region 804.

Figure 8B:
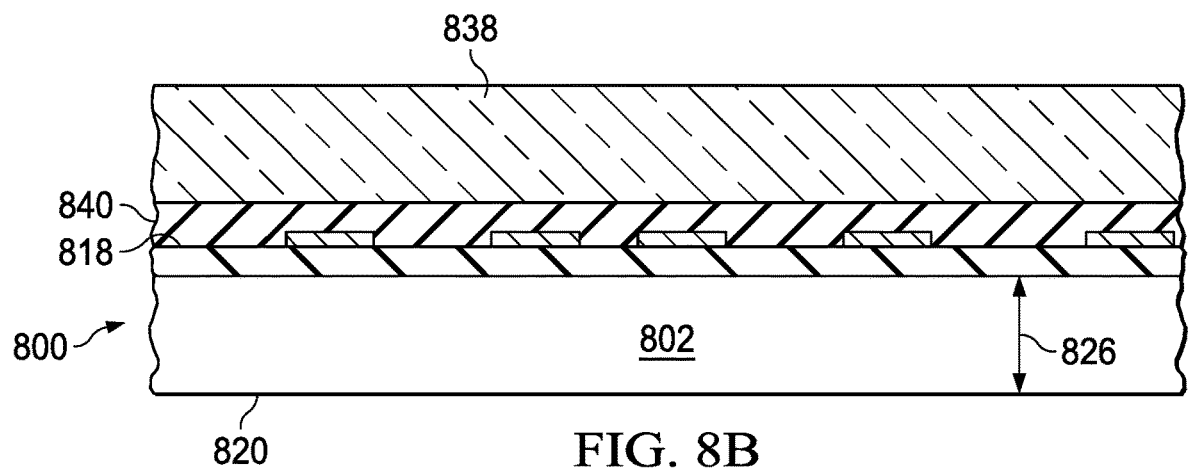

Referring to FIG. 8B, semiconductor wafer 800 is mounted on a carrier 838 with the top surface 818 of the interconnect region 804 nearest the carrier 838 and a bottom surface 820 of the substrate 802 exposed. The carrier 838 may be, for example, a silicon wafer or a ceramic or glass disk. The semiconductor wafer 800 may be mounted to the carrier 838 with a temporary bonding material 840 such as Brewer Science WaferBOND® HT-10.10.

A thickness 826 of the substrate 802 may initially be 500 microns to 600 microns, for example a full thickness of a commercial silicon wafer.

Figure 8C:
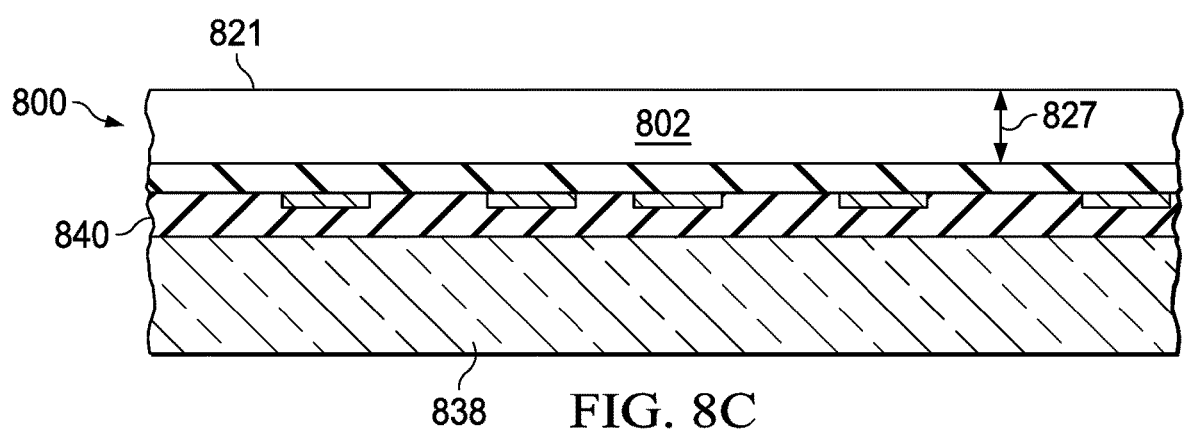

Referring to FIG. 8C, the thickness 827 of substrate 802 is reduced to approximately 100 microns, resulting from thinning the substrate 802, for example by backgrinding. The exposed surface 821 of substrate 802 may then be polished using known or later developed techniques, such as chemical mechanical polishing (CMP). Other values of the thickness 826, 827 of the substrate 802 are within the scope of the instant example.

Figure 8D:
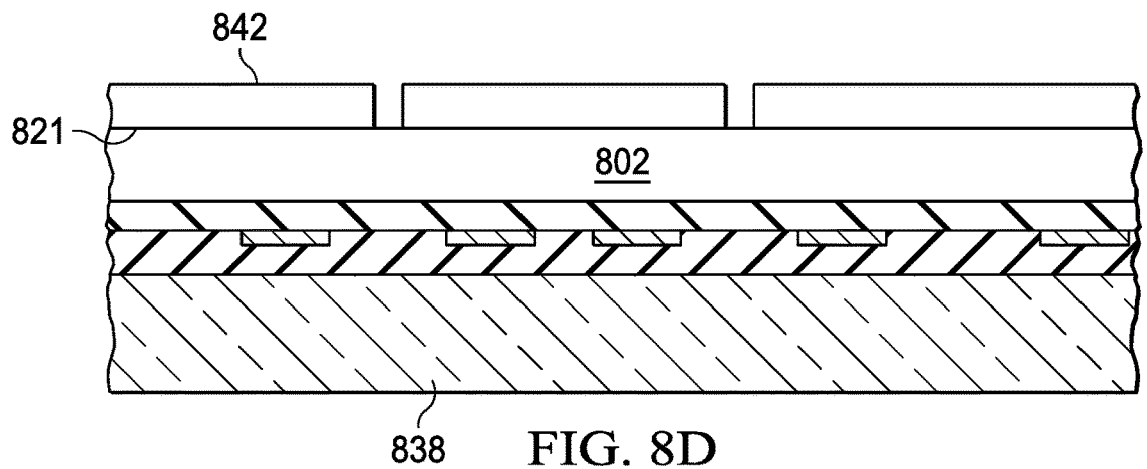

Referring to FIG. 8D, an TWT mask 842 is formed at the bottom surface 821 of the substrate 802 to expose an area for a TWT region 808. In an example, the TWT mask 842 includes primarily photoresist formed by a photolithographic process. Forming the TWT mask 842 primarily of photoresist has an advantage of low fabrication cost and may be appropriate for thinned substrates 802. In another example, the TWT mask 842 includes primarily hard mask material such as silicon nitride, silicon carbide or amorphous carbon, formed by a plasma enhanced chemical vapor deposition (PECVD) process. Forming the TWT mask 842 primarily of hard mask material has an advantage of durability and dimensional stability and may be appropriate for full-thickness substrates 802. The area exposed by the TWT mask 842 is as described in reference to FIG. 1C, FIG. 5, or FIG. 6, for example.

Figure 8E:
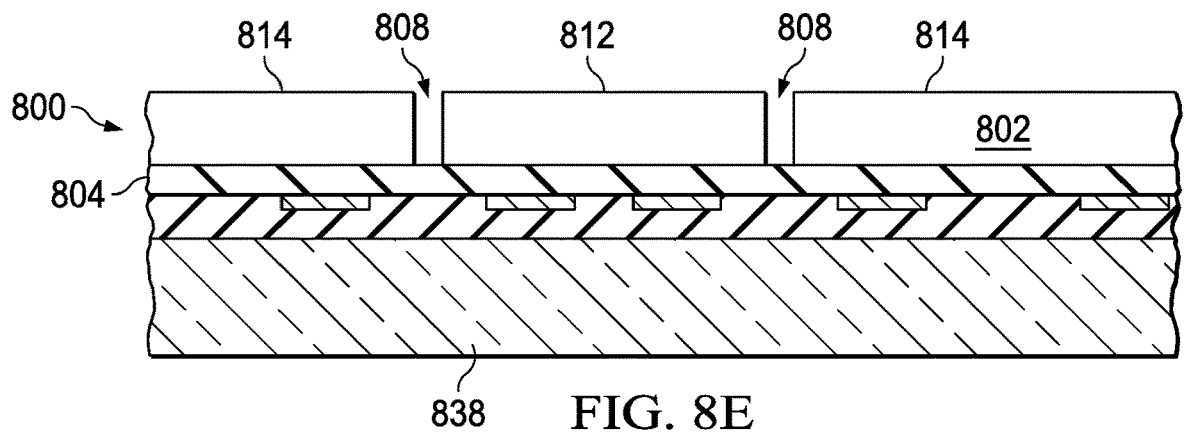

Referring to FIG. 8E, semiconductor material of the substrate 802 is removed in the area exposed by the TWT mask 842 to form high voltage region 812 that is isolated from low voltage region 814, as described in more detail hereinabove. The semiconductor material of the substrate 802 may be removed by a deep reactive ion etch (DRIE) process. One example of a DRIE process, referred to as the Bosch process, alternately removes material at a bottom of an etched region and passivates sidewalls of the etched region, to maintain a desired profile of the etched region. Another example is a continuous DRIE process which simultaneously alternately removes material at a bottom of an etched region and passivates sidewalls of the etched region. The TWT region 808 extends to the interconnect region 804. The etch process is controlled to stop on the dielectric silicon dioxide (SiO2) that forms interconnect 804. In one version of the instant example, an insignificant amount of the interconnect region 804 is removed during the TWT etch process.

Referring still to FIG. 8E, the TWT mask 842 of FIG. 8D is removed. Photoresist in the TWT mask 842 may be removed by an ash process or an ozone etch process, followed by a wet clean process. Hard mask material in the TWT mask 842 may be removed by a plasma etch process which is selective to the semiconductor material in the substrate 802 and the dielectric layers in the interconnect region 804.

Figure 8F:
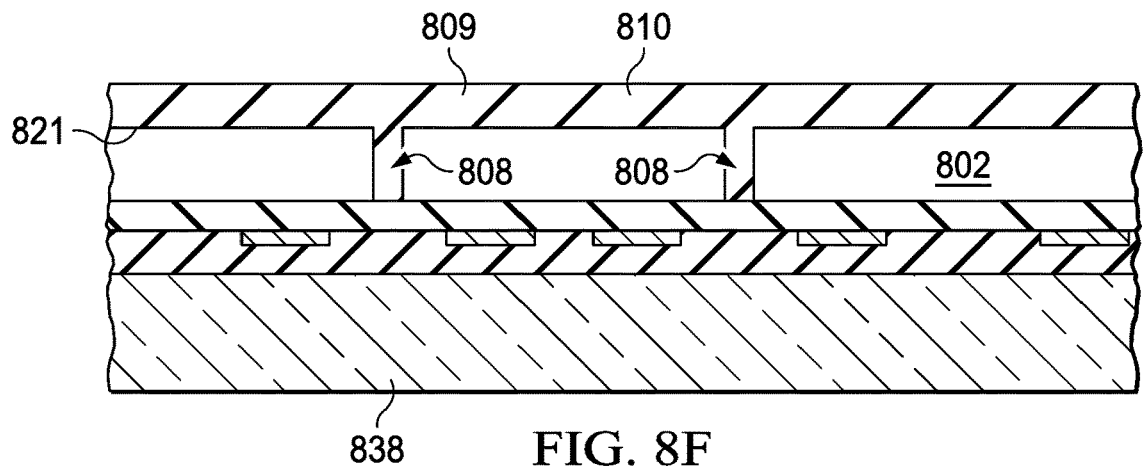

Referring to FIG. 8F, a dielectric polymer 810 is deposited into TWT region 808 and onto backside surface 821 of substrate 802 to form a backside dielectric polymer layer 809. In this example, parylene-F is the dielectric polymer 810. In another example, parylene-HT or parylene-AF4 may be used. Parylene's deposition process eliminates the wet deposition method used for other dielectric materials such as epoxy, silicone, or urethane. It begins in a chemical-vacuum chamber, with raw, powdered parylene dimer placed in a loading boat, and inserted into a vaporizer. The dimer is initially heated to between 100°-150° C., converting the solid-state parylene into a gas at the molecular level. The process requires consistent levels of heat; the temperature should increase steadily, ultimately reaching 680° C., sublimating the vaporous molecules and splitting it into a monomer.

The vaporous molecules 810 are then drawn by vacuum onto substrate 802 one molecule-at-a-time in the coating chamber, where the monomer gas reaches a final deposition phase, a cold trap. Here, temperatures are cooled drastically to levels sufficient to remove any residual parylene materials pulled through the coating chamber from the substrate, between −90° and −120° C.

Parylene's complex and specialized vapor-phase deposition technique ensures the polymer can be successfully applied as a structurally continuous backside dielectric polymer layer 809 while being entirely conformal to the characteristics of TWT region(s) 808 that are formed in substrate 802.

In another example, TWT region 808 and backside dielectric layer 809 may be formed with other types of dielectric material, such as, for example, fluid droplets containing uncured epoxy, uncured polyimide, uncured BCB, ceramic slurry, sol-gel, siloxane-containing fluid such as methylsilsesquioxane (MSQ), or glass. The dielectric-containing fluid droplets may include solvent or other volatile fluid, which is subsequently removed. The dielectric-containing fluid droplets may include two reactive component fluids, such as epoxy resin and hardener, which are mixed just prior to delivery from a droplet delivery apparatus. The dielectric-containing fluid in the TWT region 808 is cured, dried or otherwise processed, as necessary, to form the dielectric material 810 in the TWT region 808 and backside dielectric layer 809. The semiconductor wafer 800 may be, for example, baked in a vacuum or inert ambient to convert the dielectric-containing fluid into dielectric material 810. Some of these materials can use nano-size particles which will densify at low temperatures. In some cases, a low temperature glass powder might be used and then heated hot enough to melt and hence densify and fill gaps.

Figure 8G:
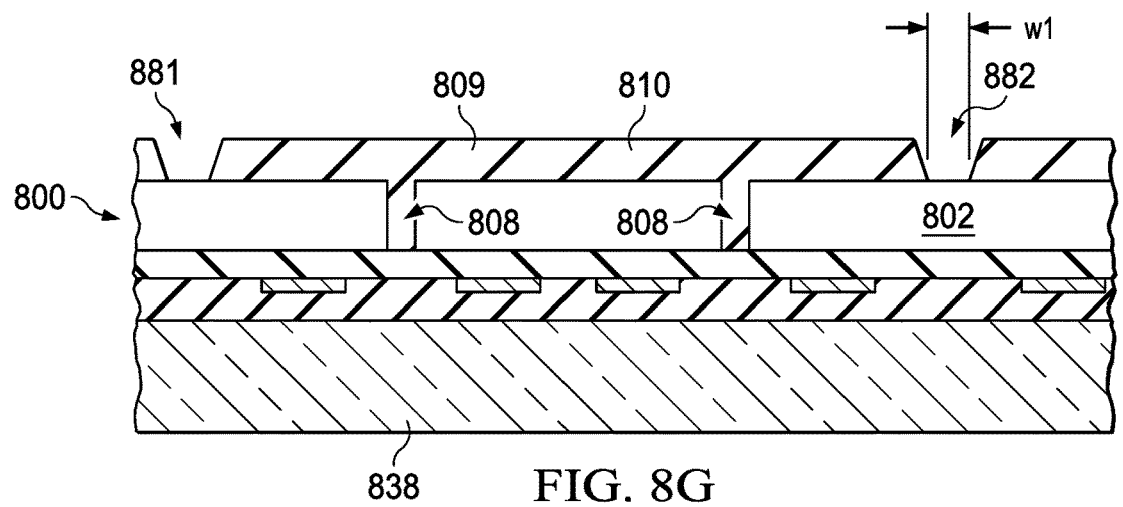

Referring to FIG. 8G, backside dielectric polymer layer 809 is processed to remove the parylene from cut-line regions 881, 882 that will be sawn or otherwise cut to separate the various devices 100 from each other. One reason to remove the parylene from the cut line regions is to keep it from interfering with the cutting process. Another reason is to allow a diffusion barrier 811 (see FIG. 8H) to be placed on the backside dielectric layer 809 that will not expose parylene backside layer 809 by the cutting process. In this example, the edges of backside dielectric layer 809 at cut-line regions 881, 882 are tapered slightly to allow a smooth deposition of diffusion barrier layer 811 (FIG. 8H).

Referring still to FIG. 8G, in one example a thick photoresist formed by a photolithographic process and a polymer etch using O2 is used to remove the parylene from cut lines 881, 882. In another example, a hard mask material such as silicon nitride, silicon carbide or amorphous carbon formed by a plasma enhanced chemical vapor deposition (PECVD) process is used to remove parylene from cut line regions 881, 882. In another example, a laser ablation process is used to remove parylene from cut line regions 881, 882.

Figure 8H:
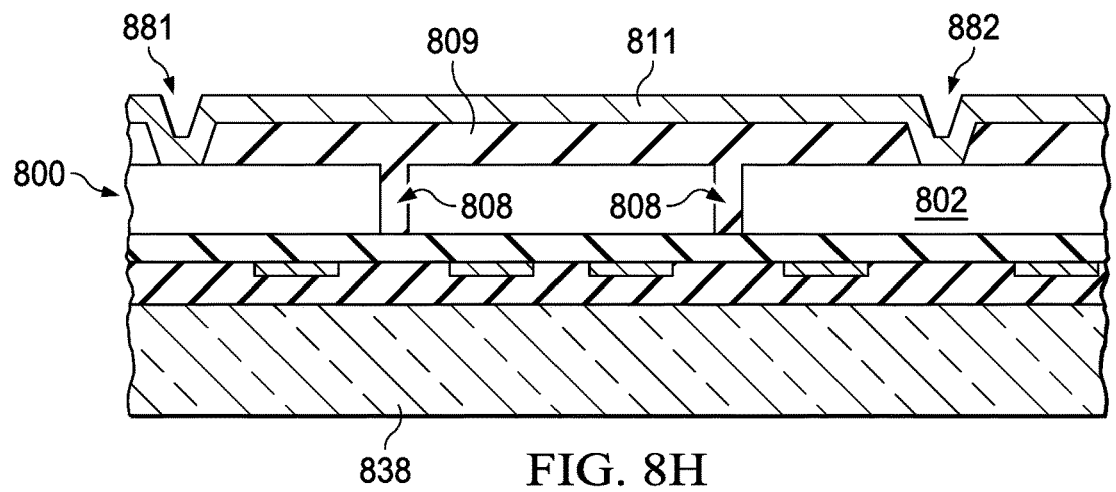

Referring to FIG. 8H, a diffusion barrier layer 811 is deposited over backside dielectric polymer layer 809. In one example, diffusion barrier layer 811 is a layer of SiN that is thick enough such that the CTE mismatch with parylene layer 809 does not crack diffusion barrier 811. In another example, diffusion layer 811 is a metal diffusion barrier. Some examples of typical interconnect or packaging metals include Ta, Ti, TiW, TaN, TiN, Al, Cu, Ag, or Au. In this case, copper (Cu), for example, is electroplated onto an adhesion layer Cu seed layer on top of a titanium (Ti) or titanium tungsten (TiW) barrier layer using a sputter, e-beam, CVD or later developed plating technique. In some examples, a pattern may be used to deposit thick Cu only in areas of dielectric polymer layer 809 that need to be protected from moisture absorption.

Prior to depositing diffusion barrier 811, parylene 810 is baked to remove any latent moisture and to densify the parylene. As discussed with reference to FIG. 4, removing moisture from parylene may improve its resistivity by a factor of 100×-1000×. The resistivity of the parylene typically requires lower temperatures for long times (such as 250 C for 24 hr) or higher temperatures for short times (400 C for 1 hr). More baking typically improves the resistivity although too much baking especially in oxygen environments will result in degradation. After baking, diffusion barrier 811 should be applied in a timely manner to prevent diffusion of moisture back into the parylene 810.

Figure 8I:
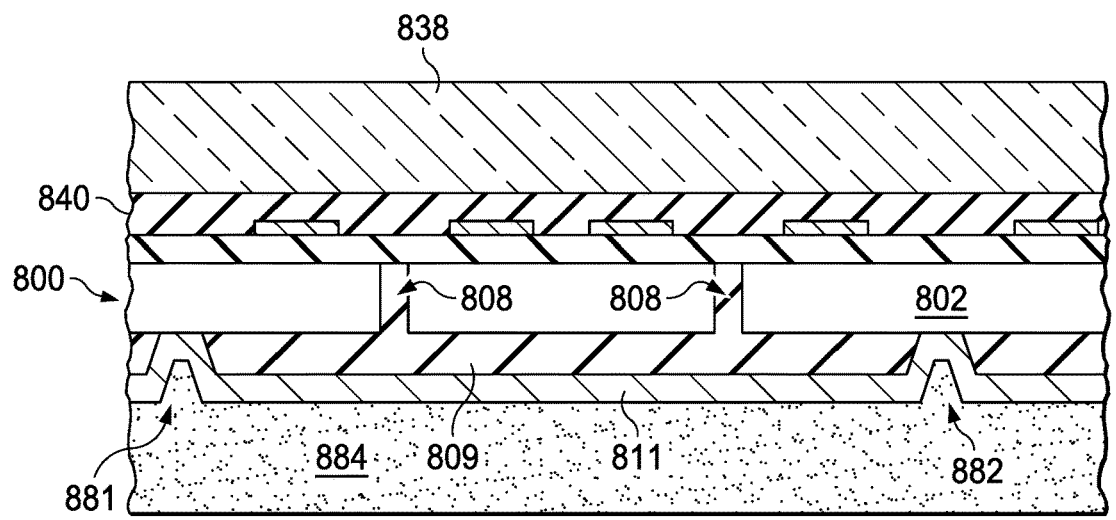

Referring to FIG. 8I, semiconductor wafer 800 is mounted on tape 884 to provide support while carrier 838 is removed. Tape 884 is a known or later developed tape that is used in the fabrication of ICs.

Figure 8J:
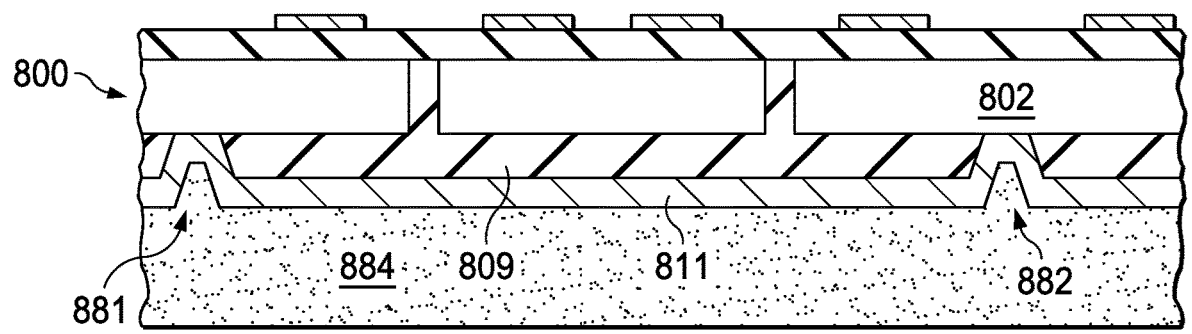

Referring to FIG. 8J, semiconductor wafer 800 is removed from the carrier 838 of FIG. 8I. The semiconductor wafer 800 may be removed, for example, by heating the temporary bonding material 840 of FIG. 8I to soften the temporary bonding material 840 using a laser or other heat source, and laterally sliding the semiconductor wafer 800 off the carrier 838. The temporary bonding material 840 is subsequently removed, for example by dissolving in an organic solvent.

Figure 8K:
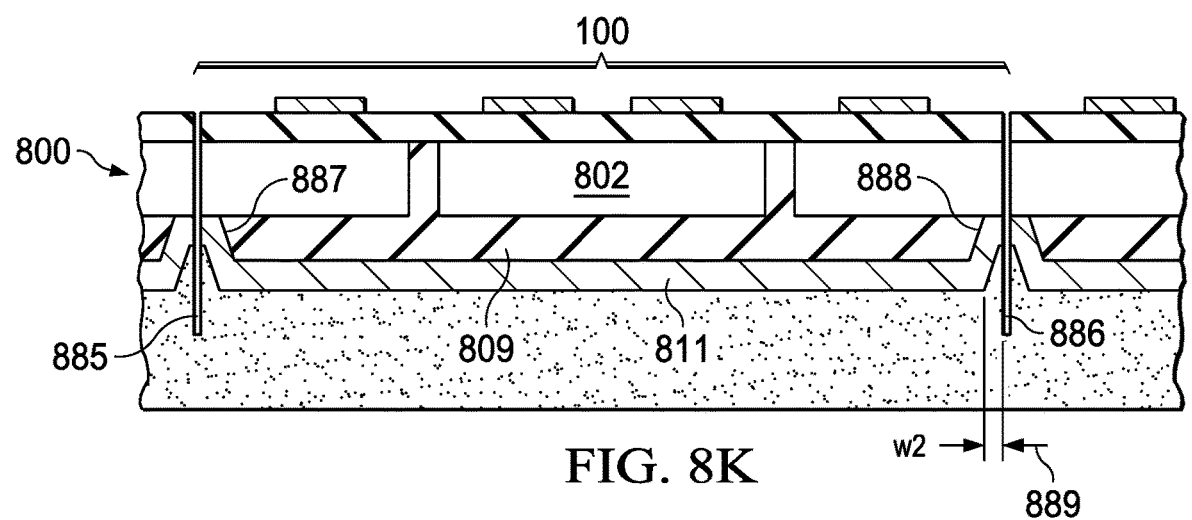

Referring to FIG. 8K, the multiple semiconductor devices 100 included on semiconductor wafer 800 are singulated as indicated at example cut lines 885, 886 using known or later developed singulation techniques, such as mechanical sawing, laser cutting, etc. Many additional cut lines (not shown) are formed to singulate all the semiconductor devices 100 that were fabricated in parallel on wafer 800.

Referring still to FIG. 8K, edges of backside dielectric polymer 887, 888 are not exposed by the singulation process and diffusion barrier 811 remains intact to completely seal and protect backside dielectric layer 809 due to the removal of a portion of the backside dielectric layer 809 in cutline region 881, 882 (FIG. 8G) prior to deposition of diffusion barrier 811. Referring to FIG. 8G, the portion of parylene that is removed from cut-line region 881, 882 has a width w1 that is wide enough so that after diffusion barrier layer 811 is applied, there is still a space 889 having a width w2 between the edge of backside dielectric layer 809 and the peripheral edge substrate 802 of IC 100 that is wide enough so that edges 887, 888 of backside dielectric polymer layer 809 are not exposed by the singulation process.

Referring still to FIG. 8K, each of the multiple semiconductor devices 100 are then packaged using known or later developed IC packaging techniques as described with reference to FIG. 2 to form a packaged IC 200.

In this manner, a packaged IC is provided that includes substrate isolation at lower cost and much higher flexibility than prior techniques.

The voltage capability of the isolation can be changed by layout by simply changing the trench width and/or the number of trenches across the silicon wafer. The backside isolation can be changed by varying the thickness of the backside dielectric polymer layer.

3D capacitance communication using TWT may be cheaper compared to standard connection techniques using special metal and/or dielectric stacks.

OTHER EMBODIMENTS

In described examples, the substrate material is silicon. While silicon is the prevalent material for wafers used in the electronics industry, other compound III-V or II-VI materials have also been employed and may be fabricated with isolated regions using through wafer trenches and backside dielectric polymer layer has described herein above. For example, Gallium arsenide (GaAs) is a III-V semiconductor that can be produced via the Czochralski process. Gallium nitride (GaN) and Silicon carbide (SiC) are also common wafer materials.

In described examples, the isolated region is an island completely surrounded by the primary region. In another example, the TWT may extend across a width of the semiconductor die to effectively divide the die into two portions.

In described examples, the TWT region forms a square or rectangle. In other examples, the TWT may be curved to form a circular, elliptical, or other shape of region.

In described examples, a single 3D capacitor is illustrated. In other examples, two or more 3D capacitors may be fabricated using additional through wafer trenches to support additional communication coupling, for example.

In described examples, a high voltage region and a low voltage region are illustrated. In other examples, there may be more than two regions that are isolated from each other via through wafer trenches as described hereinabove.

In described examples, a high voltage region and a low voltage region are illustrated. In other examples, a region may be isolated for a different reason, such as for example: signal isolation, ground isolation, temperature isolation, etc.

In described examples, the substrate is background to a thickness of approximately 100 microns. In other examples, the finished thickness may be thinner or thicker as needed for known or later developed fabrication techniques.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. An integrated circuit (IC) comprising:
   a substrate of semiconductor material having a first surface, a second surface opposite the first surface, and a perimeter edge around the first and second surfaces, the substrate having a first region with a first transistor formed therein and a second region with a second transistor therein;
   a through wafer trench (TWT) extending from the first surface to the second surface, the TWT separating the first region from the second region;
   an interconnect region having layers of dielectric on the first surface, the interconnect region being continuous over the first region, the second region, and the TWT; and
   a dielectric polymer in the TWT and in a backside dielectric polymer layer over a portion of the second surface, the dielectric polymer layer having an outer surface and an edge, in which the edge of the dielectric polymer layer is separated from the perimeter edge of the substrate by a space.

2. The IC of claim 1, further comprising a moisture diffusion barrier on the outer surface and the edge of the dielectric polymer layer.

3. The IC of claim 2, wherein the moisture diffusion barrier is silicon nitride or a metal.

4. The IC of claim 1, wherein the TWT has a width in a range of 3-50 microns.

5. The IC of claim 1, wherein the TWT includes through wafer trenches having respective widths in a range of 5-15 microns.

6. The IC of claim 1, wherein the backside dielectric polymer layer has a thickness in a range of 3-50 microns.

7. The IC of claim 1, wherein the dielectric polymer is a perylene compound.

8. The IC of claim 1, wherein the dielectric polymer is a fluorinated parylene compound.

9. The IC of claim 1, further comprising a three-dimensional (3D) capacitor having a first plate coupled to the first transistor and a second plate coupled to the second transistor, in which the TWT is a first TWT having a portion between the first plate and the second plate, the first plate is within a separate portion of the first region, the second plate is within a separate portion of the second region, the separate portion of the first region is bounded by a second TWT extending from the first surface to the second surface, and the separate portion of the second region is bounded by a third TWT extending from the first surface to the second surface.

10. The IC of claim 9, wherein the portion of the first TWT has a serpentine path between the first plate and the second plate.

* * * * *